(12) United States Patent
Li

(10) Patent No.: US 11,372,774 B2
(45) Date of Patent: Jun. 28, 2022

(54) METHOD AND SYSTEM FOR A SOLID STATE DRIVE WITH ON-CHIP MEMORY INTEGRATION

(71) Applicant: Alibaba Group Holding Limited, George Town (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 23 days.

(21) Appl. No.: 17/000,983

(22) Filed: Aug. 24, 2020

(65) Prior Publication Data

US 2022/0058136 A1   Feb. 24, 2022

(51) Int. Cl.
| | |
|---|---|
| *G06F 12/1009* | (2016.01) |
| *G06F 12/0875* | (2016.01) |
| *G06F 12/02* | (2006.01) |
| *G11C 14/00* | (2006.01) |

(52) U.S. Cl.
CPC ...... *G06F 12/1009* (2013.01); *G06F 12/0253* (2013.01); *G06F 12/0875* (2013.01); *G06F 2212/1024* (2013.01); *G06F 2212/1028* (2013.01); *G06F 2212/1044* (2013.01); *G06F 2212/657* (2013.01); *G11C 14/0063* (2013.01)

(58) Field of Classification Search
None
See application file for complete search history.

(56) References Cited

U.S. PATENT DOCUMENTS

| | | | |
|---|---|---|---|
| 3,893,071 | A | 7/1975 | Bossen |
| 4,562,494 | A | 12/1985 | Bond |
| 4,718,067 | A | 1/1988 | Peters |
| 4,775,932 | A | 10/1988 | Oxley |
| 4,858,040 | A | 8/1989 | Hazebrouck |
| 5,394,382 | A | 2/1995 | Hu |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS

C. Wu, D. Wu, H. Chou and C. Cheng, "Rethink the Design of Flash Translation Layers in a Component-Based View", in IEEE Acess, vol. 5, pp. 12895-12912, 2017.

(Continued)

*Primary Examiner* — Charles J Choi
(74) *Attorney, Agent, or Firm* — Shun Yao; Yao Legalservices, Inc.

(57) ABSTRACT

Embodiments include a system for facilitating data storage. During operation, the system receives a request to write data associated with a logical block address (LBA), wherein the LBA indicates a die to which to write the data and includes a sub-LBA which is used as an index for a mapping table stored on the die. The system assigns, based on the LBA, a physical block address (PBA) which indicates the die and includes a sub-PBA which indicates a first physical location in a block of the die at which the data is to be stored. The system stores, in the mapping table based on the sub-LBA, the PBA. The system writes the PBA and the data to the block based on the PBA.

20 Claims, 11 Drawing Sheets

(56) References Cited

U.S. PATENT DOCUMENTS

| | | |
|---|---|---|
| 5,602,693 A | 2/1997 | Brunnett |
| 5,715,471 A | 2/1998 | Otsuka |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,527,544 B1 | 9/2013 | Colgrove |
| 8,751,763 B1 | 6/2014 | Ramarao |
| 8,819,367 B1 | 8/2014 | Fallone |
| 8,825,937 B2 | 9/2014 | Atkisson |
| 8,832,688 B2 | 9/2014 | Tang |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,031,296 B2 | 5/2015 | Kaempfer |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,213,627 B2 | 12/2015 | Van Acht |
| 9,280,472 B1 | 3/2016 | Dang |
| 9,280,487 B2 | 3/2016 | Candelaria |
| 9,311,939 B1 | 4/2016 | Malina |
| 9,336,340 B1 | 5/2016 | Dong |
| 9,436,595 B1 | 9/2016 | Benitez |
| 9,495,263 B2 | 11/2016 | Pang |
| 9,529,601 B1 | 12/2016 | Dharmadhikari |
| 9,529,670 B2 | 12/2016 | O'Connor |
| 9,575,982 B1 | 2/2017 | Sankara Subramanian |
| 9,588,698 B1 | 3/2017 | Karamcheti |
| 9,588,977 B1 | 3/2017 | Wang |
| 9,607,631 B2 | 3/2017 | Rausch |
| 9,671,971 B2 | 6/2017 | Trika |
| 9,747,202 B1 | 8/2017 | Shaharabany |
| 9,852,076 B1 | 12/2017 | Garg |
| 9,875,053 B2 | 1/2018 | Frid |
| 9,912,530 B2 | 3/2018 | Singatwaria |
| 9,946,596 B2 | 4/2018 | Hashimoto |
| 10,013,169 B2 | 7/2018 | Fisher |
| 10,199,066 B1 | 2/2019 | Feldman |
| 10,229,735 B1 | 3/2019 | Natarajan |
| 10,235,198 B2 | 3/2019 | Qiu |
| 10,268,390 B2 | 4/2019 | Warfield |
| 10,318,467 B2 | 6/2019 | Barzik |
| 10,361,722 B2 | 7/2019 | Lee |
| 10,437,670 B1 | 10/2019 | Koltsidas |
| 10,459,663 B2 | 10/2019 | Agombar |
| 10,642,522 B2 | 5/2020 | Li |
| 10,649,657 B2 | 5/2020 | Zaidman |
| 10,678,432 B1 | 6/2020 | Dreier |
| 10,756,816 B1 | 8/2020 | Dreier |
| 10,928,847 B2 | 2/2021 | Suresh |
| 10,990,526 B1 * | 4/2021 | Lam .................... G06F 12/0804 |
| 2001/0032324 A1 | 10/2001 | Slaughter |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0112085 A1 | 8/2002 | Berg |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0267752 A1 | 12/2004 | Wong |
| 2004/0268278 A1 | 12/2004 | Hoberman |
| 2005/0038954 A1 | 2/2005 | Saliba |
| 2005/0097126 A1 | 5/2005 | Cabrera |
| 2005/0138325 A1 | 6/2005 | Hofstee |
| 2005/0144358 A1 | 6/2005 | Conley |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0101197 A1 | 5/2006 | Georgis |
| 2006/0156012 A1 | 7/2006 | Beeson |
| 2006/0184813 A1 | 8/2006 | Bui |
| 2007/0033323 A1 | 2/2007 | Gorobets |
| 2007/0061502 A1 | 3/2007 | Lasser |
| 2007/0101096 A1 | 5/2007 | Gorobets |
| 2007/0250756 A1 | 10/2007 | Gower |
| 2007/0266011 A1 | 11/2007 | Rohrs |
| 2007/0283081 A1 | 12/2007 | Lasser |
| 2007/0283104 A1 | 12/2007 | Wellwood |
| 2007/0285980 A1 | 12/2007 | Shimizu |
| 2008/0034154 A1 | 2/2008 | Lee |
| 2008/0065805 A1 | 3/2008 | Wu |
| 2008/0082731 A1 | 4/2008 | Karamcheti |
| 2008/0112238 A1 | 5/2008 | Kim |
| 2008/0163033 A1 | 7/2008 | Yim |
| 2008/0301532 A1 | 12/2008 | Uchikawa |
| 2009/0006667 A1 | 1/2009 | Lin |
| 2009/0089544 A1 | 4/2009 | Liu |
| 2009/0113219 A1 | 4/2009 | Aharonov |
| 2009/0125788 A1 | 5/2009 | Wheeler |
| 2009/0183052 A1 | 7/2009 | Kanno |
| 2009/0254705 A1 | 10/2009 | Abali |
| 2009/0282275 A1 | 11/2009 | Yermalayeu |
| 2009/0287956 A1 | 11/2009 | Flynn |
| 2009/0307249 A1 | 12/2009 | Koifman |
| 2009/0307426 A1 | 12/2009 | Galloway |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0060722 A1 | 3/2011 | Li |
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |

(56) References Cited

U.S. PATENT DOCUMENTS

| | | |
|---|---|---|
| 2011/0258514 A1 | 10/2011 | Lasser |
| 2011/0289263 A1 | 11/2011 | McWilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | D Abreu |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0294684 A1 | 10/2015 | Qjang |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0132237 A1 | 5/2016 | Jeong |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |

(56) References Cited

U.S. PATENT DOCUMENTS

| | | |
|---|---|---|
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Jung |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0321864 A1 | 11/2018 | Benisty |
| 2018/0322024 A1 | 11/2018 | Nagao |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0116127 A1 | 4/2019 | Pismenny |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0317901 A1 | 10/2019 | Kachare |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0089430 A1 | 3/2020 | Kanno |
| 2020/0097189 A1 | 3/2020 | Tao |
| 2020/0143885 A1 | 5/2020 | Kim |
| 2020/0159425 A1 | 5/2020 | Flynn |
| 2020/0167091 A1 | 5/2020 | Haridas |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0326855 A1 | 10/2020 | Wu |
| 2020/0328192 A1 | 10/2020 | Zaman |
| 2020/0348888 A1 | 11/2020 | Kim |
| 2020/0387327 A1 | 12/2020 | Hsieh |
| 2020/0401334 A1 | 12/2020 | Saxena |
| 2020/0409791 A1 | 12/2020 | Devriendt |
| 2021/0010338 A1 | 1/2021 | Santos |
| 2021/0089392 A1 | 3/2021 | Shirakawa |
| 2021/0103388 A1 | 4/2021 | Choi |

FOREIGN PATENT DOCUMENTS

| | | |
|---|---|---|
| WO | 9418634 | 8/1994 |
| WO | 1994018634 | 8/1994 |

OTHER PUBLICATIONS

Po-Liang Wu, Yuan-Hao Chang and T. Kuo, "A file-system-aware FTL design for flash-memory storage systems," 2009, pp. 393-398.

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.

A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.

J. Jung and Y. Won, "nvramdisk: A Transactional Block Device Driver for Non-Volatile RAM", in IEEE Transactions on Computers, vol. 65, No. 2, pp. 589-600, Feb. 1, 2016.

Te I et al. (Pensieve: a Machine Assisted SSD Layer for Extending the Lifetime: (Year: 2018).

ARM ("Cortex-R5 and Cortex-R5F", Technical reference Manual, Revision r1p1) (Year:2011).

https://web.archive.org/web/20071130235034/http://en.wikipedia.org:80/wiki/logical_block_addressing Wikipedia screen shot retriefed on wayback Nov. 20, 2007 showing both physical and logical addressing used historically to access data on storage devices (Year: 2007).

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST'11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

(56) References Cited

OTHER PUBLICATIONS

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime, "Design, Automation & Text in Europe Conference & Exhibition (DATE), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

* cited by examiner

METHOD AND SYSTEM FOR A SOLID STATE DRIVE WITH ON-CHIP MEMORY INTEGRATION

BACKGROUND

Field

This disclosure is generally related to the field of data storage. More specifically, this disclosure is related to a method and system for a solid state drive with on-chip memory integration.

Related Art

Today, various storage systems are being used to store and access the ever-increasing amount of digital content. A storage system can include storage servers with one or more storage devices or drives (such as a solid-state drive (SSD)). A storage device or drive can include storage media with persistent memory, i.e., a non-volatile memory. A conventional SSD generally requires a double data rate (DDR) controller and dynamic random access memory (DRAM) interface in order to access its internal DRAM. This DDR controller and DRAM interface may consume a high amount of power and may also require a significant cost. In addition, due to the volatile nature of DRAM and the loss of data stored in DRAM in the occurrence of a power loss, a conventional SSD must implement power loss protection (e.g., in hardware and firmware) in order to ensure data consistency. As the capacity of storage drives continues to increase, so increases the amount of corresponding metadata which must be stored. In some instances, the amount of storage space required for the corresponding metadata can be on the order of tens of Gigabytes (GBs).

Thus, while conventional SSDs can store an increasing amount of data, some challenges remain in storing the corresponding increasing amount of metadata and in the cost and power consumption involved in using DRAM within the conventional SSDs. These challenges can limit the efficiency of the overall storage system.

SUMMARY

One embodiment provides a system which facilitates data storage. During operation, the system receives a request to write data associated with a logical block address (LBA), wherein the LBA indicates a die to which to write the data and includes a sub-LBA which is used as an index for a mapping table stored on the die. The system assigns, based on the LBA, a physical block address (PBA) which indicates the die and includes a sub-PBA which indicates a first physical location in a block of the die at which the data is to be stored. The system stores, in the mapping table based on the sub-LBA, the PBA. The system writes the PBA and the data to the block based on the PBA.

In some embodiments, prior to storing the PBA in the mapping table and prior to writing the PBA and the data to the block based on the PBA, the system stores, in the mapping table based on the sub-LBA, a physical cache location in a write cache residing on the die. The system writes the PBA and the data to the physical cache location in the write cache. Responsive to writing the PBA and the data from write cache to the block, the system stores the PBA in the mapping table by replacing, in the mapping table, the physical cache location with the PBA. The system generates an acknowledgement for a host of a completion of the write request, wherein generating the acknowledgement and writing the PBA and the data from the write cache to the block are performed asynchronously.

In some embodiments, the system assigns a predetermined percentage of a plurality of blocks of the die for overprovisioning.

In some embodiments, the system performs an intra-die garbage collection process by the following operations. The system detects that a number of free blocks of the die is less than a first predetermined number. The system identifies a target block of the die for recycling based on a number of valid pages in the target block. The system copies a valid page of data from the target block to a new page in a destination block of the die. The system replaces, in the mapping table, a first PBA associated with the valid page of data from the target block with a new PBA associated with the new page in the destination block of the die.

In some embodiments, the system receives a request to read the data associated with the LBA. The system performs, based on the sub-LBA, a search in the mapping table to obtain the physical cache location or the PBA. Responsive to obtaining the physical cache location and determining that the data is stored at the physical cache location in the write cache, the system retrieves the data from the write cache based on the physical cache location. Responsive to obtaining the PBA and determining that the data is stored at the PBA on the die, the system retrieves the data from the die based on the PBA.

In some embodiments, the LBA and the PBA indicate the die as an index for the die which comprises a same number of most significant bits of the LBA and the PBA.

In some embodiments, the mapping table is ordered based on an ascending fixed order for a plurality of sub-LBAs.

In some embodiments, the mapping table is stored in a static random access memory (SRAM) residing on the die. The SRAM, the write cache, and a plurality of blocks including the first block reside on a bottom layer of a plurality of layers of the die.

In some embodiments, a storage system comprises a plurality of dies including the die, and the dies comprise Not-And (NAND) flash dies. A respective die includes a respective static random access memory (SRAM), a respective write cache, and a respective plurality of blocks. A respective mapping table stored in the respective SRAM stores mappings of logical information to physical information for data stored on the respective die in the respective write cache and in the respective plurality of blocks.

In some embodiments, the storage system comprises at least a storage device. The storage device comprises the plurality of dies, a NAND interface, a controller, and a host interface. The storage device does not include an internal dynamic random access memory (DRAM).

Another embodiment provides an apparatus or a storage device, comprising a plurality of NAND dies. A respective NAND die comprises: a plurality of blocks which are configured to store data; and a static random access memory (SRAM) residing on the respective NAND die, wherein the SRAM is configured to store metadata associated with data stored in the blocks or in a write cache of the respective NAND die.

BRIEF DESCRIPTION OF THE FIGURES

In the figures, like reference numerals refer to the same figure elements.

DETAILED DESCRIPTION

Figure 1:
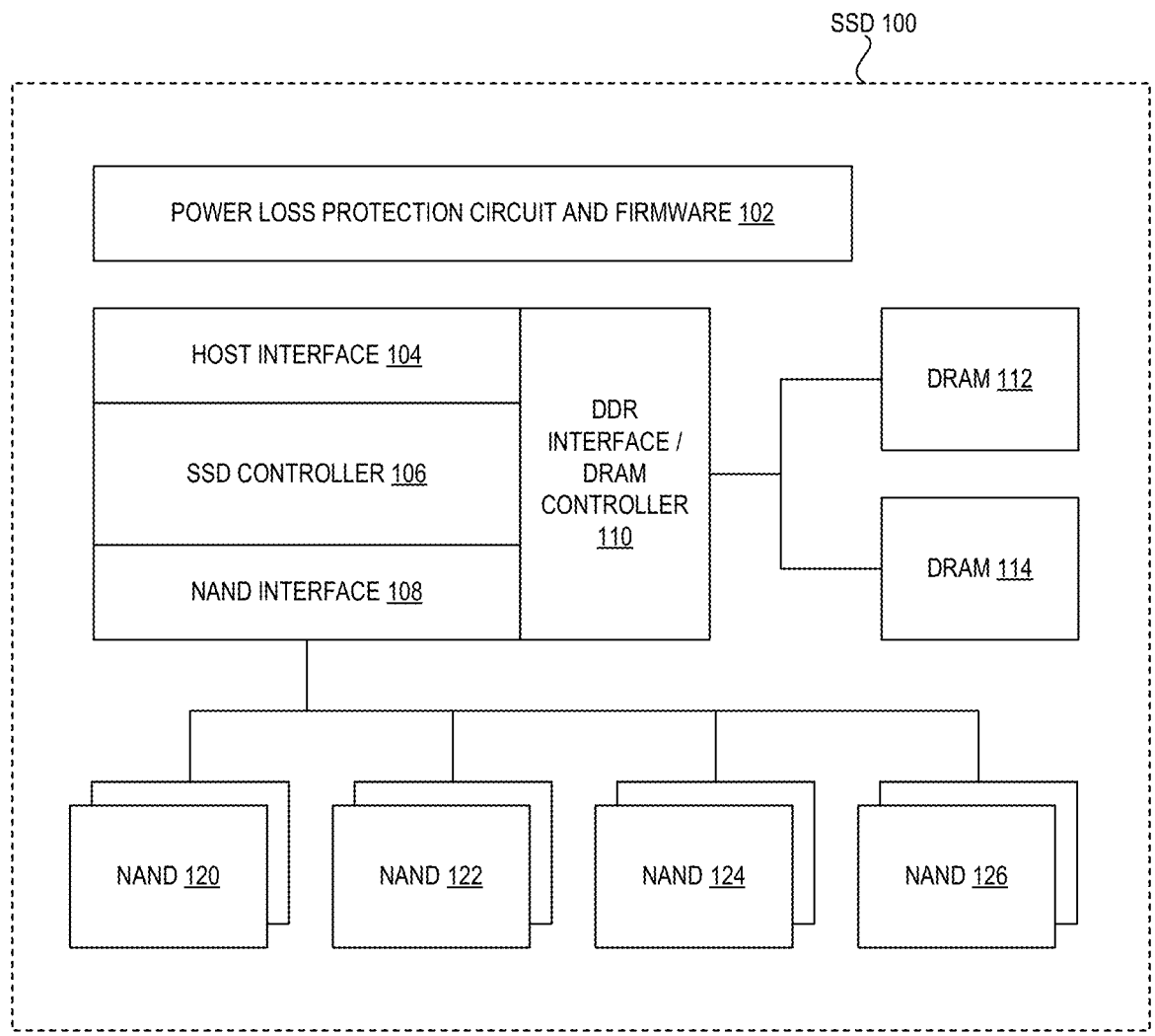
FIG. 1 illustrates an exemplary storage device, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein provide a system which integrates on-chip mapping table management and a data cache, without using the expensive and power-consuming DRAM of conventional storage devices. In addition, the described embodiments provide an intra-die garbage collection which can reduce the amount of internal data traffic among multiple NAND dies.

As described above, the DDR controller and DRAM interface is generally used by a conventional SSD in order to access its internal DRAM. This DDR controller and DRAM interface may consume a high amount of power and may also require a significant cost. In addition, due to the volatile nature of DRAM and the loss of data stored in DRAM in the occurrence of a power loss, a conventional SSD must implement power loss protection (e.g., in hardware and firmware) in order to ensure data consistency. As the capacity of storage drives continues to increase, so increases the amount of corresponding metadata which must be stored. In some instances, the amount of storage space required for the corresponding metadata can be on the order of tens of Gigabytes (GBs).

Thus, while conventional SSDs can store an increasing amount of data, some challenges remain in storing the corresponding increasing amount of metadata and in the cost and power consumption involved in using DRAM within the conventional SSDs. These challenges can limit the efficiency of the overall storage system.

The embodiments described herein address the constraints and challenges associated with conventional storage devices by integrating a mapping table for each NAND die in an SRAM which resides on the bottom layer of the NAND die and by implementing a write cache in a persistent memory which also resides on the bottom layer of the NAND die. This intra-die mapping also provides for a more efficient intra-die garbage collection. In the described embodiments, the system can partition the large amount of metadata by distributing or storing the metadata across multiple NAND dies, where an on-chip SRAM can provide localized metadata storage and querying for a more efficient storage system which does not require DRAM or power loss protection, as described below in relation to FIGS. 2 and 3.

In the described embodiments, an SSD can integrate an SRAM and write cache in the bottom layer of each NAND die, which can result in intra-die mapping management. Such a storage device no longer needs to include the off-chip DRAM, the DRAM controller, and the DDR interface. Thus, by eliminating the need for these expensive and power-consuming elements, the described embodiments can result in a reduction in the expense of the design and cost of the overall storage device, and can also result in a more efficient overall storage system.

A "distributed storage system" or a "storage system" can include multiple storage servers. A "non-volatile storage system" can include non-volatile memory. A "storage server" or a "storage system" can refer to a computing device which can include multiple storage devices or storage drives. A "storage device" or a "storage drive" refers to a device or a drive with a non-volatile memory which can provide persistent storage of data, e.g., a solid state drive (SSD), or a flash-based storage device. A storage system can also be a computer system.

"Non-volatile memory" refers to storage media which may be used for persistent storage of data, e.g., flash memory of a NAND die of an SSD, magnetoresistive random access memory (MRAM), phase change memory (PCM), resistive random access memory (ReRAM), or another non-volatile memory. A "non-volatile storage system" refers to a storage system which includes at least one type of non-volatile memory or physical media which can persistently store data.

A "computing device" refers to any server, device, node, entity, drive, or any other entity which can provide any computing capabilities.

In this disclosure, a "logical block address" or "LBA" includes a "NAND die index" as its most significant bits (MSBs) and a "sub-LBA" as its least significant bits (LSBs). The term "NAND die index" refers to an index which identifies a specific NAND die, and the sub-LBA can be used as an index for a mapping table stored on the die.

In this disclosure, a "physical block address" or "PBA" includes a "NAND die index" as its most significant bits (MSBs) and a "sub-PBA" as its least significant bits (LSBs). The term "NAND die index" refers to an index which identifies a specific NAND die, and the sub-PBA can indicate a physical location in a block of the die at which data is to be stored.

The term "write cache" refers to a temporary data cache or region which can store data in a persistent memory or a non-volatile memory. The term "physical cache location" refers to a location in the write cache.

A "mapping table" refers to a data structure which stores logical to physical information, e.g., an LBA to a PBA or other physical location. In this disclosure, a mapping table can refer to data stored in an SRAM residing on a die. LBAs can be partitioned and interleaved across a plurality of dies, as described below in relation to FIG. 3. A mapping table can be indexed based on an ascending order for sub-LBAs, and can store a physical location associated with each sub-LBA index, without storing the actual sub-LBA itself. The physical location can be a physical cache location in a write cache residing on the same die, or a PBA of a block residing on the same die.

The term "intra-die garbage collection" refers to a recycling or a garbage collection process or operation which occurs within each die of a storage device, as described below in relation to FIGS. 6 and 7B.

Exemplary Storage Device in the Prior Art

FIG. 1 illustrates an exemplary storage device, such as an SSD 100, in accordance with the prior art. SSD 100 can include: a power loss protection circuit and firmware 102; a host interface 104; an SSD controller 106; a NAND interface 108, which communicates with or is coupled to NANDs 120, 122, 124, and 126; and a DDR interface/DRAM controller 110, which manages, communicates with, or is coupled to DRAMs 112 and 114. In conventional SSD 100, SSD controller 106 must implement DDR interface/DRAM controller 110 in order to access DRAMs 112 and 114. DDR interface/DRAM controller 110 may consume a high amount of power and may also require a significant cost. In addition, due to the volatile nature of DRAM and the loss of data stored in DRAM in the occurrence of a power loss, conventional SSD 100 must implement power loss protection circuit and firmware 102 in hardware and firmware in order to ensure data consistency. As the capacity of storage drives continues to increase, so increases the amount of corresponding metadata which must be stored. In some instances, the amount of storage space required for the corresponding metadata can be on the order of tens of Gigabytes (GBs).

Thus, the conventional storage device which requires a DDR interface/DRAM controller in order to access the DRAM may result in a significant expense in terms of both cost and power consumption. In addition, the power loss protection is necessary to protect the data in the volatile DRAM, and may be required to protect an increasingly large amount of metadata, to align with the continued growth in capacity of storage drives. These constraints can limit the flexibility and performance of the overall storage system.

Exemplary Storage Device Including On-Chip Memory Integration

The embodiments described herein address the constraints and challenges associated with conventional storage devices (such as in FIG. 1) by integrating a mapping table for each NAND die in an SRAM which resides on the bottom layer of the NAND die and by implementing a write cache in a persistent memory which also resides on the bottom layer of the NAND die. This intra-die mapping can also provide for a more efficient intra-die garbage collection, as described below in relation to FIG. 6. In the described embodiments, the system can partition the large amount of metadata by distributing or storing the metadata across the NAND dies, where an on-chip SRAM can provide localized metadata storage and querying for a more efficient storage system which does not require DRAM or power loss protection.

Figure 2:
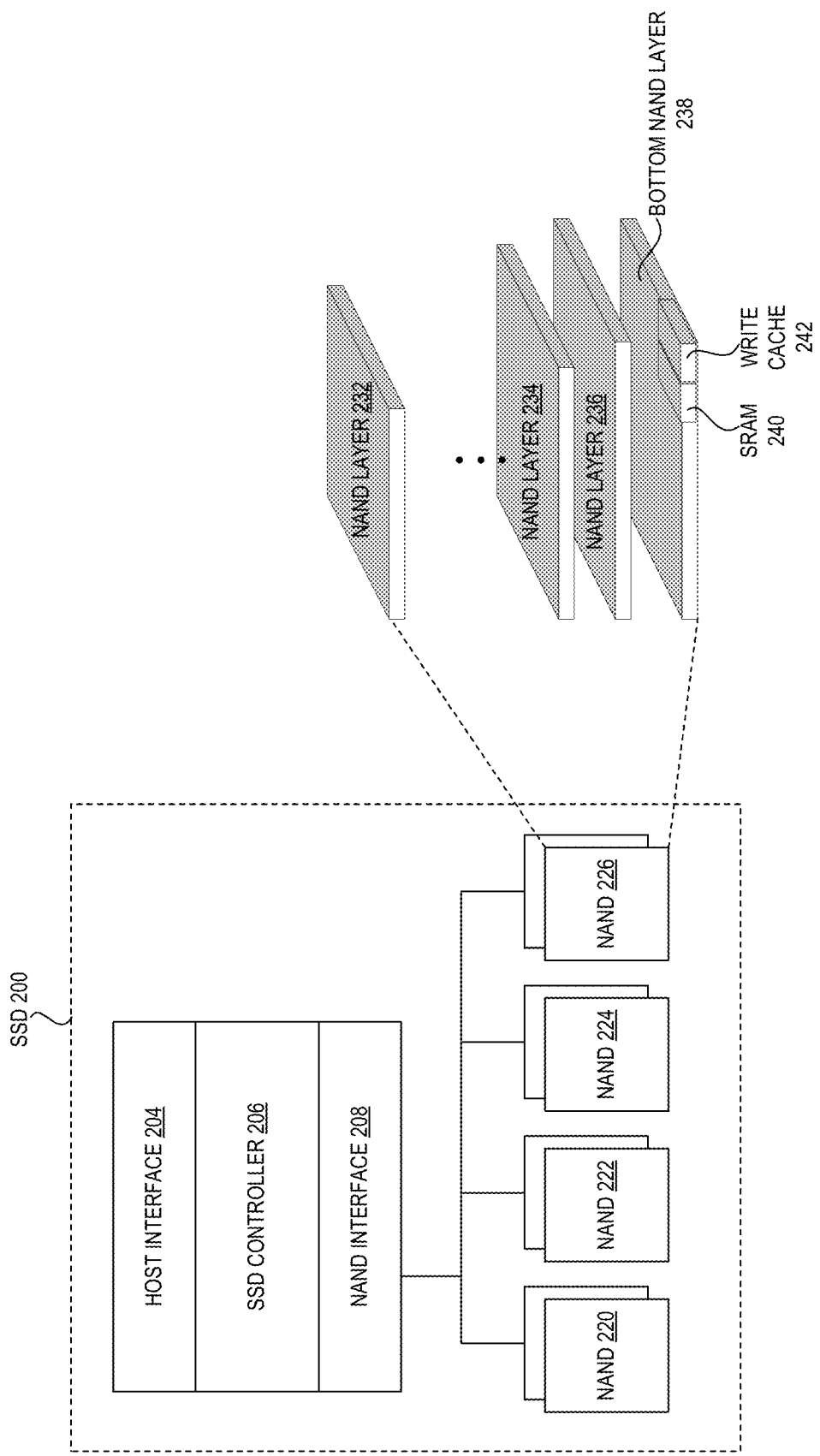
FIG. 2 illustrates an exemplary storage device, including on-chip memory integration, in accordance with an embodiment of the present application.

FIG. 2 illustrates an exemplary storage device SSD 200, including on-chip memory integration, in accordance with an embodiment of the present application. SSD 200 can include: a host interface 204; an SSD controller 206; and a NAND interface 208, which communicates with or is coupled to NAND dies 220, 222, 224, and 226. Each NAND die can include a plurality of layers, such as a three-dimensional (3D) NAND die. For example, NAND 226 can include a plurality of layers, including: a NAND layer 232; a NAND layer 234; a NAND layer 236; and a bottom NAND layer 238. Bottom NAND layer 238 can include: an SRAM 240; and a write cache 242. Bottom NAND layer 238 has sufficient physical space or area in which to place peripheral circuits, e.g., via a micro-design or as integrated modules in a circuit in the bottom layer. SRAM 240 can store a die-specific mapping table, as described below in relation to FIGS. 3 and 4. Write cache 242 can be a persistent memory or any non-volatile memory, such as NAND flash memory, magnetoresistive random access memory (MRAM), phase change memory (PCM), resistive random access memory (ReRAM), or another non-volatile memory.

SSD 200 can integrate SRAM 240 and write cache 242 in the bottom layer of each NAND die, which can result in intra-die mapping management, as described below in relation to FIGS. 3 and 4. Furthermore, SSD 200 no longer needs to include the off-chip DRAM, the DRAM controller, and the DDR interface (as in conventional SSD 100 of FIG. 1). By removing these expensive and power-consuming elements or components from the storage device (e.g., SSD 200), the described embodiments can result in a reduction in the expense of the design and cost of the overall storage device, and can also result in a more efficient overall storage system.

Exemplary Mapping Tables and LBA Format

Figure 3:
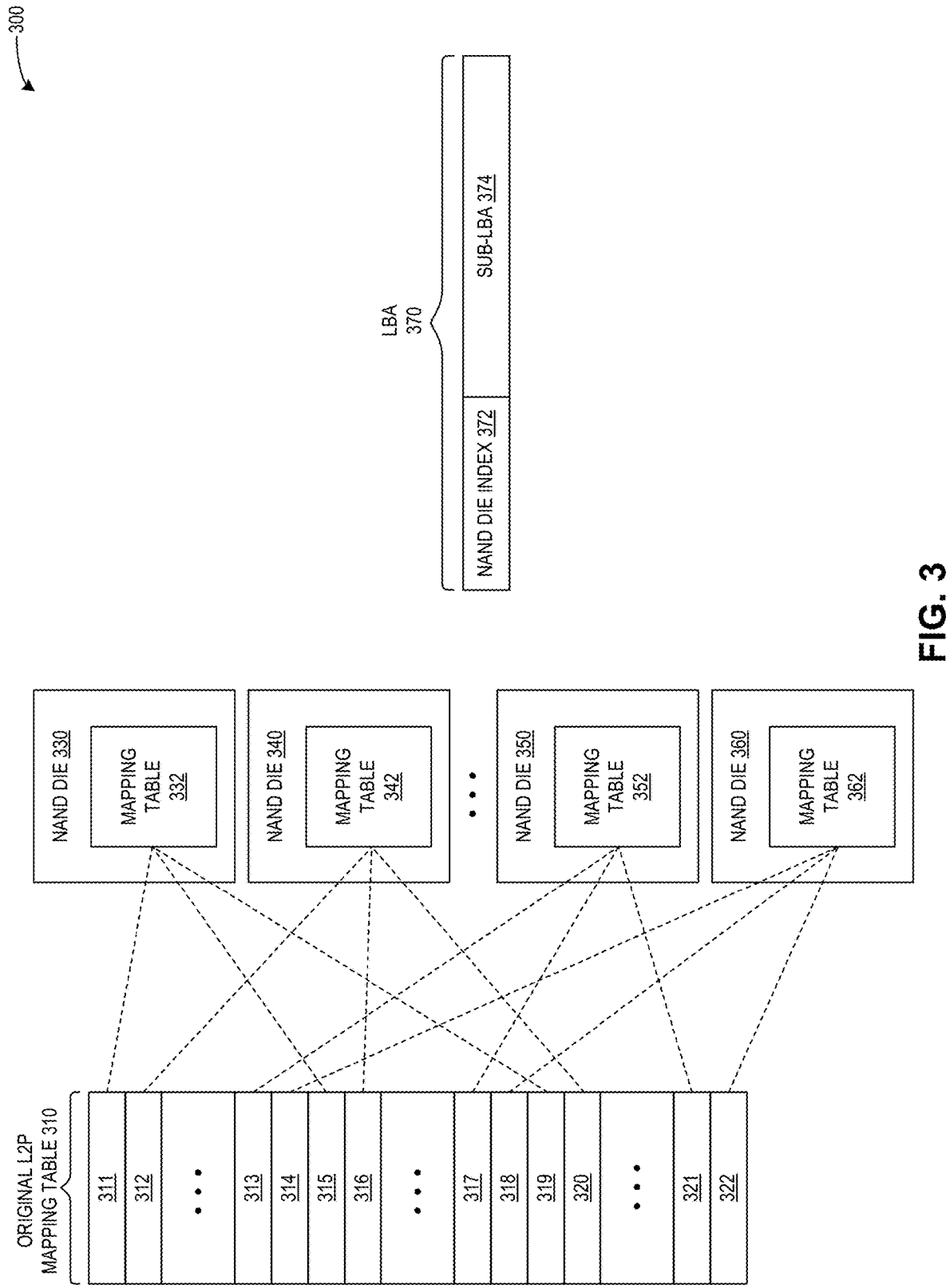
FIG. 3 illustrates an exemplary partition of a mapping table among multiple dies, in accordance with an embodiment of the present application.
Figure 4:
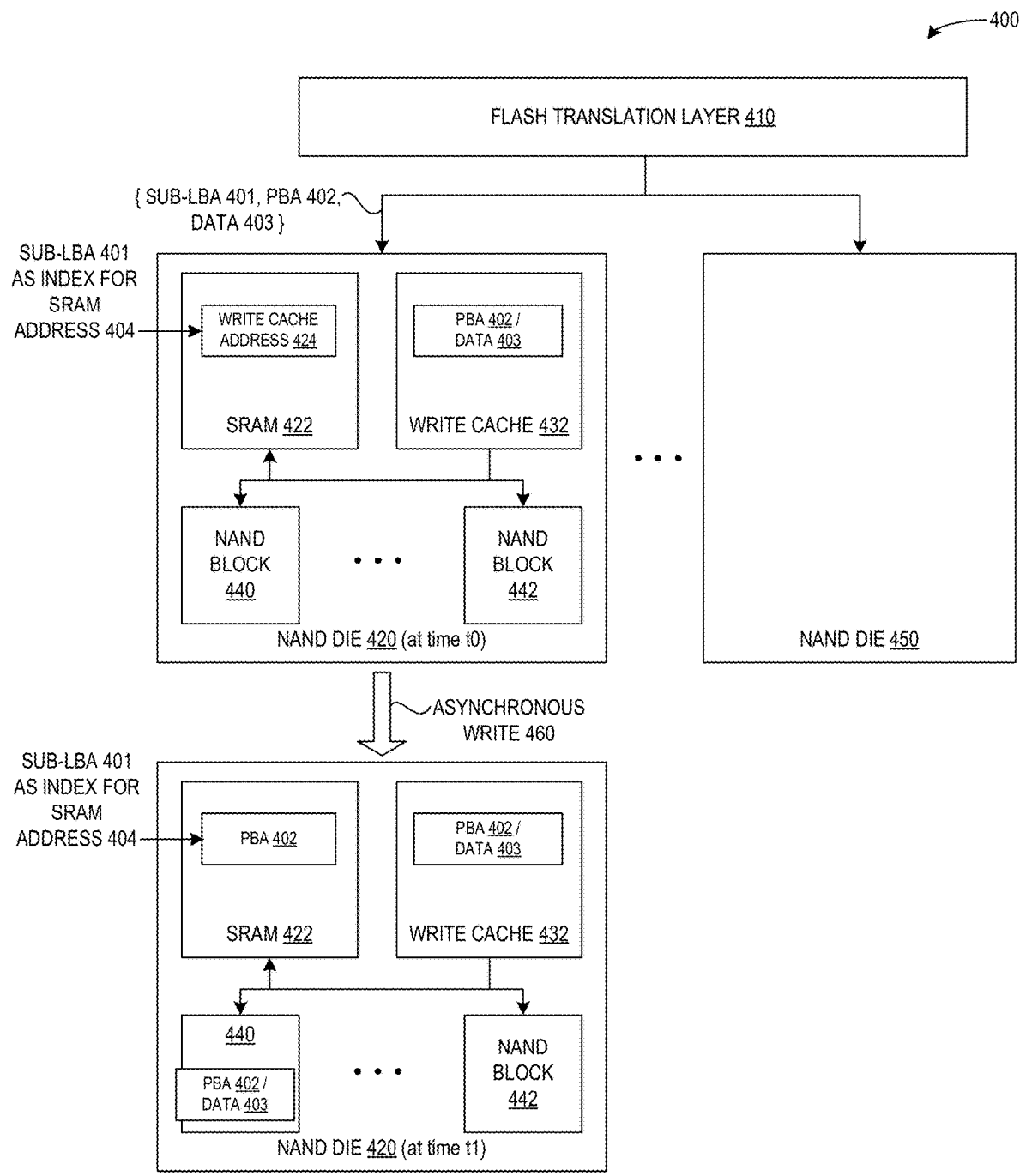
FIG. 4 illustrates an exemplary environment for data storage, in accordance with an embodiment of the present application.

FIG. 3 illustrates an exemplary partition 300 of a mapping table among multiple dies, in accordance with an embodiment of the present application. Given an original logical-to-physical (L2P) mapping table 310, partition 300 can be based on the number of available NAND dies. The system can interleave the LBAs into each NAND die. In each LBA, the most significant bits (MSBs) of the LBA can indicate the NAND die index, and the least significant bits (LSBs) can be used as an index for the mapping table stored on the given die. An exemplary format for an LBA 370 can include a NAND die index 372 in the MSBs and a sub-LBA 374 in the LSBs. In addition, because the LBA is used both as the index for the mapping table to locate the specific NAND die (as indicated by the MSBs in the NAND die index) and as the access address for the SRAM (or PBA of the die), the system does not need to store the LBA itself in the mapping table, which can result in saving tens of bits for each LBA entry of the mapping table.

Note that each mapping table is ordered based on an ascending order of LBAs (or sub-LBAs). The system can use the fixed ascending order of the LBAs (or sub-LBAs) in a mapping table to store the corresponding SRAM access address (e.g., the physical cache location in the write cache).

LBA 311 can be associated with a mapping table 332 of NAND die 330 (e.g., on the bottom layer of NAND die 330 in an SRAM which resides on NAND die 330). LBA 311 itself is not stored in mapping table 332. Instead, LBA 311, which includes a NAND die index and a sub-LBA, corresponds to the NAND die indicated by its NAND die index (i.e., NAND die 330), and also corresponds to an entry in mapping table 332 of NAND die 330 based on where the sub-LBA fits into the ascending ordered list of sub-LBAs as indices, which correspond to a physical location. In some instances, this physical location indicates a physical cache location in the write cache (e.g., the access address for the SRAM to an address in the write cache), and in other instances, this physical location indicates the PBA in NAND die 330 at which data corresponding to the sub-LBA (or LBA 311) is stored. Similarly: LBA 312 can be associated with a mapping table 342 of NAND die 340; LBA 313 can be associated with a mapping table 352 of a NAND die 350; LBA 314 can be associated with a mapping table 362 of a NAND die 360. In the same manner, the subsequent LBAs of mapping table 310 can be interleaved among the mapping tables of the plurality of NAND dies in the manner shown, e.g.: LBA 315 can be associated with mapping table 332; LBA 316 can be associated with mapping table 342; LBA 317 can be associated with mapping table 352; LBA 318 can be associated with mapping table 362; LBA 319 can be associated with mapping table 332; LBA 320 can be associated with mapping table 342; LBA 321 can be associated with mapping table 352; and LBA 322 can be associated with mapping table 362.

The system can interleave the LBAs by assigning the LBAs to or associated with LBAs with a given NAND die. In some embodiments, a flash translation layer (FTL) can manage or perform the assignment or association of a respective LBA as well as assign a corresponding PBA on a block of the same die associated with the respective LBA.
Exemplary Environment for Data Storage: Write Operation and Intra-Die Garbage Collection FIG. 4 illustrates an exemplary environment 400 for data storage, in accordance with an embodiment of the present application. Environment 400 can include a flash translation layer 410 and a plurality of NAND dies, such as a NAND die 420 (at a time t0) and a NAND die 450. Each NAND die can include a plurality of NAND blocks. Each NAND die can also include a plurality of layers, such as in a 3D NAND die, where the bottom layer includes an SRAM which stores and manages a mapping table and a write cache for temporary storage of data for low-latency access. For example, NAND die 420 (at time t0) can include: an SRAM 422 with a mapping table indicated as an entry with an index of sub-LBA 401 and a value of a write cache location 424; a write cache 432; and NAND blocks 440 and 442.

During operation, a storage system of environment 400 can receive data to be written to a non-volatile memory of the storage system. The data can be associated with an LBA, where the LBA indicates a die to which to write the data and includes a sub-LBA which is used as an index for a mapping table stored on the die. FTL 410 can assign, based on the LBA, a PBA which indicates the die and includes a sub-PBA which indicates a first physical location in a block of the die at which the data is to be stored. FTL 410 can determine to transmit a sub-LBA 401, a PBA 402, and data 403 to NAND die 420 (e.g., based on the MSBs of the LBA, which can indicate a NAND die index corresponding to NAND die 420). Each die can be labeled with a fixed index or identifier which is predetermined or preconfigured by the system. The system can use sub-LBA 401 as an index for SRAM address 404 (e.g., an entry 404), and can store a write cache address 424 in the mapping table of SRAM 422. The system can write PBA 402 and data 403 to write cache 432, and can generate an acknowledgment for a host of a completion of the write request (not shown). That is, the system can acknowledge the write request as complete when data 403 has been successfully written to write cache 432, prior to, separate from, or asynchronously from data 403 being written to a block of NAND die 420.

At a subsequent time (or asynchronously), the system can perform an asynchronous write 460, which involves writing PBA 402 and data 403 to NAND block 440 at PBA 402. Responsive to this asynchronous write, the system can replace (or overwrite), in the mapping table, write cache address 424 (i.e., the physical cache location) with PBA 402, as shown in NAND die 420 (at time t1).

After data 403 has been written to write cache 432, the system can receive a request to read data 403. The read request can be associated with an LBA, including sub-LBA 401. The system can determine, based on the MSBs of the LBA (which indicate the NAND die), that the corresponding mapping table to be queried is stored in SRAM 422 of NAND die 420. The system can perform, based on sub-LBA 401, a search in the mapping table of SRAM 422, to obtain the physical location stored in the mapping table (e.g., entry 404). If the mapping table stores the physical cache location (e.g., write cache address 424), the system can determine that data 403 is stored in write cache 432, and can retrieve data 403 from write cache 432 based on write cache address 424. If the mapping table stores the PBA (e.g., PBA 402), the system can determine that data 403 is stored in NAND block 440 at PBA 402, and can retrieve data 403 from block 440 based on PBA 402.

The system can also receive a write request which is an update to data already stored in a non-volatile memory of the system (e.g., in a write cache or in a NAND block of a die). In NAND die 420, since SRAM 422 and the persistent memory of write cache 432 can both support an in-place update or write, the system can follow the procedure described above in FIG. 4 for writing new data, by: storing the updated data at a newly assigned PBA; and updating the SRAM mapping table entry accordingly, with the newly assigned PBA.
Overprovisioning Recall that in the described embodiments, the system assigns the PBA in the same NAND die as the NAND die associated with the LBA. Similar to the LBA, the PBA can also be divided into two parts: the NAND die index; and the sub-PBA, as described below in relation to FIG. 5. Given an LBA and a corresponding LBA, the NAND die indicated in both the LBA and the PBA is the same. That is, the MSBs of both the LBA and the correspondingly assigned PBA match or are the same.

Figure 5:
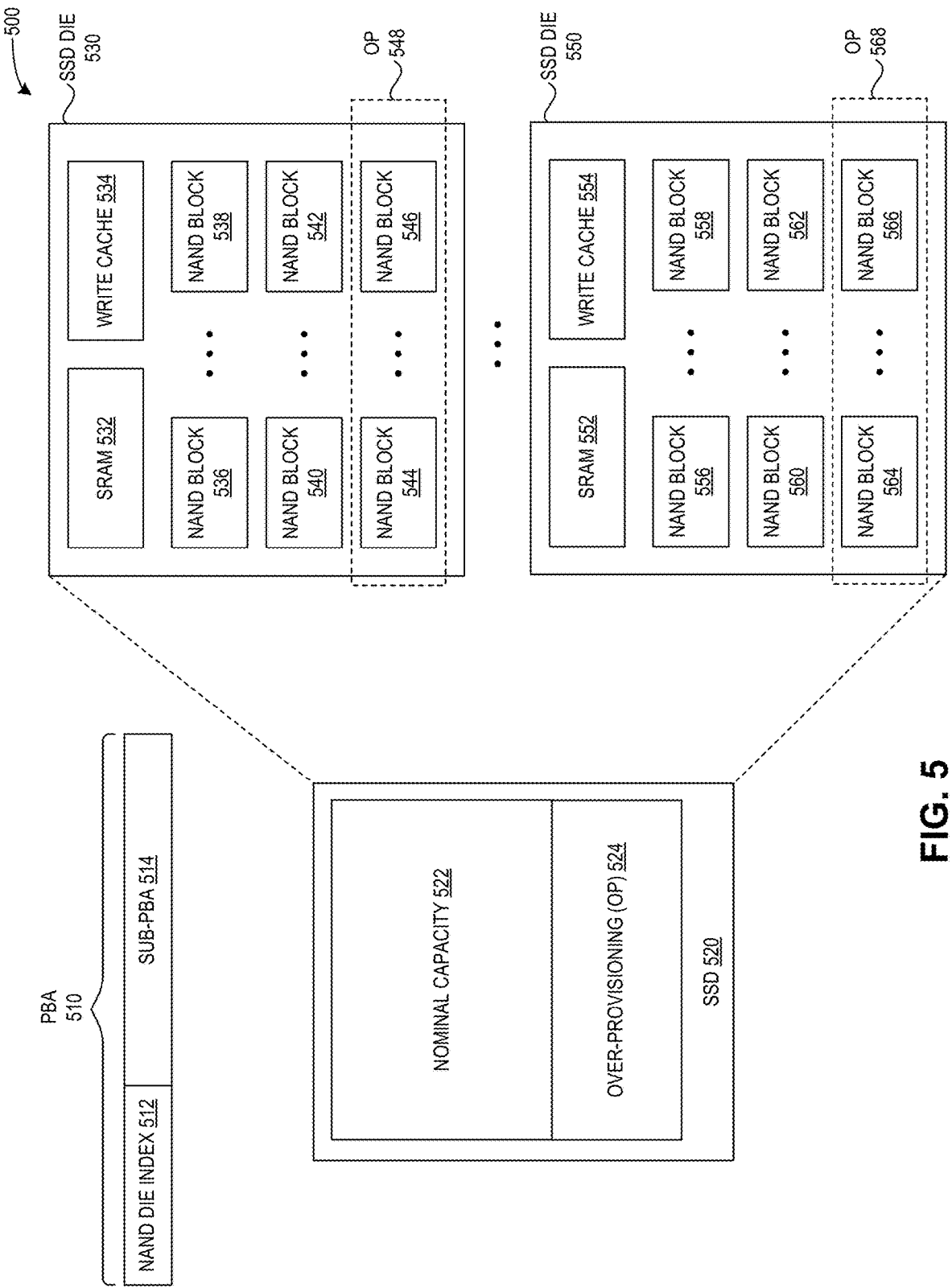
FIG. 5 illustrates an exemplary environment of free and overprovisioned blocks in a storage device, in accordance with an embodiment of the present application.

FIG. 5 illustrates an exemplary environment 500 of free and overprovisioned blocks in a storage device, in accordance with an embodiment of the present application. An exemplary format for a PBA 510 can include: a NAND die index 512, which indicates the die to which to write the data; and a sub-PBA 514, which indicates a physical location in a block of the die at which the data is to be stored.

Environment 500 can include an SSD 520, which can include a nominal capacity 522 and an overprovisioning (OP) 524. SSD 520 can include a plurality of NAND dies, e.g., SSD dies 530 and 550. Each SSD NAND die can include an SRAM, a write cache, blocks which provide nominal capacity, and OP blocks which are assigned based on a percentage of blocks of the given NAND die. For example, SSD NAND die 530 can include: an SRAM 532, which can store a mapping table such as described above in relation to FIGS. 3 and 4); a write cache 534, which can be a persistent or a non-volatile memory for temporary storage of data and low-latency access; NAND blocks 536, 538, 540, 542, 544, and 546. The system can assign NAND blocks 544 and 546 as an OP 548, based, e.g., on a predetermined percentage of the plurality of blocks which is to be used for OP. As a result, NAND blocks 536, 538, 540, and 542 can serve as storage for data based on a nominal capacity, while NAND blocks 544 and 546 can be used specifically for OP purposes. Similarly, SSD die 550 can include: an SRAM 552; a write cache 554; nominal capacity NAND blocks 556, 558, 560, and 562; and an OP 568 of NAND blocks 564 and 566.

The system can maintain a predetermined percentage of free blocks for OP purposes, and the system can perform garbage collection inside each NAND die (i.e., "intra-die garbage collection"). The system can determine that the number of free blocks is below a certain predetermined threshold, number, or percentage, and as a result, the system can initiate an intra-die garbage collection, as described below in relation to FIG. 6.

Intra-Die Garbage Collection without Controller Involvement

Figure 6:
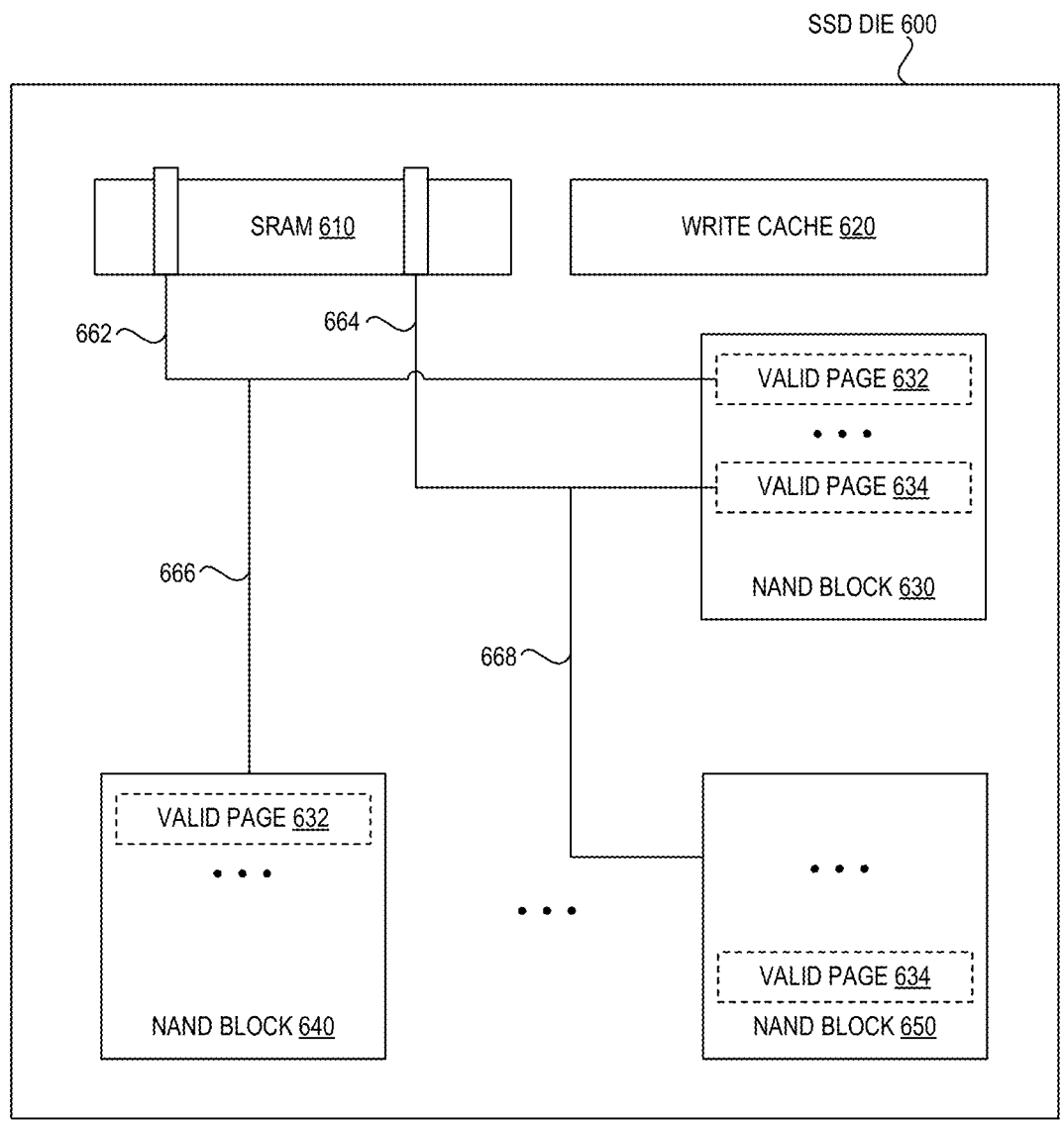
FIG. 6 illustrates an intra-die garbage collection without controller involvement, in accordance with an embodiment of the present application.

FIG. 6 illustrates an intra-die garbage collection without controller involvement, in accordance with an embodiment of the present application. An SSD die 600 can include: an SRAM 610; a write cache 620; and NAND blocks 630, 640, and 650. The system can detect that a number of free blocks of SSD die 600 is less than a first predetermined number (or threshold or percentage). The system can select or identify certain NAND blocks with a number of valid pages less than a second predetermined number, and can copy valid pages out to a destination page or block of SSD die 600. The system can also perform an in-place overwrite of the physical information in the mapping table stored in SRAM 610.

For example, the system can identify a target NAND block 630 of SSD die 600 for recycling based on a number of valid pages in NAND block 630, as compared to the second predetermined number. The system can copy a valid page 632 from NAND block 630 to a new page in NAND block 640 at a new PBA (as indicated by a communication 666). The system can also update the physical location information in the mapping table stored in SRAM 610, by replacing the PBA associated with valid page 632 from NAND block 630 (target block) with the new PBA of the new page in NAND block 640 (destination block) (as indicated by a communication 662).

Similarly, the system can copy a valid page 634 from NAND block 630 to a new page in NAND block 650 at a new PBA (as indicated by a communication 668). The system can also update the physical location information in the mapping table stored in SRAM 610, by replacing the PBA associated with valid page 634 from NAND block 630 (target block) with the new PBA of the new page in NAND block 640 (destination block) (as indicated by a communication 664).

The raw read data of valid pages 632 and 634 from NAND block 630 may contain a certain number of erroneous bits, where these noisy pages are written to a destination page in another block of the same NAND die (i.e., respectively, blocks 640 and 650). The system can maintain the data based mainly on data retention. After a certain period of time (e.g., based on a predetermined time period, interval, or retention threshold), the system can scrub the data internally based on an error code correction (ECC) process.

In a conventional SSD, background garbage collection operations may both consume the resources of the controller and reduce the overall throughput, which can affect the performance of the SSD and result in a bottleneck associated with the NAND flash controller. By providing intra-die recycling, the described embodiments can reduce the path of communications involved, which can result in reducing, eliminating, or avoiding the bottleneck associated with the throughput of the NAND flash controller in the conventional SSD. By eliminating communications with the NAND flash controller in order to perform the intra-die garbage collection, the system can result in a decrease in the consumption of the resources of the NAND controller, which can result in an improved and more efficient overall storage system.

Furthermore, the conventional SSD generally performs an ECC-related operation for every garbage collection. In contrast, in the described embodiments, data retention may be short, based on data which is updated or recycled frequently, which allows the system to tolerate a low number of error bits. Thus, the system may perform ECC operations on this noisy data less frequently than in the conventional SSD, which can also result in an improved and more efficient overall storage system.

Method for Facilitating Data Storage: Write Operation and Intra-Die Recycling

Figure 7A:
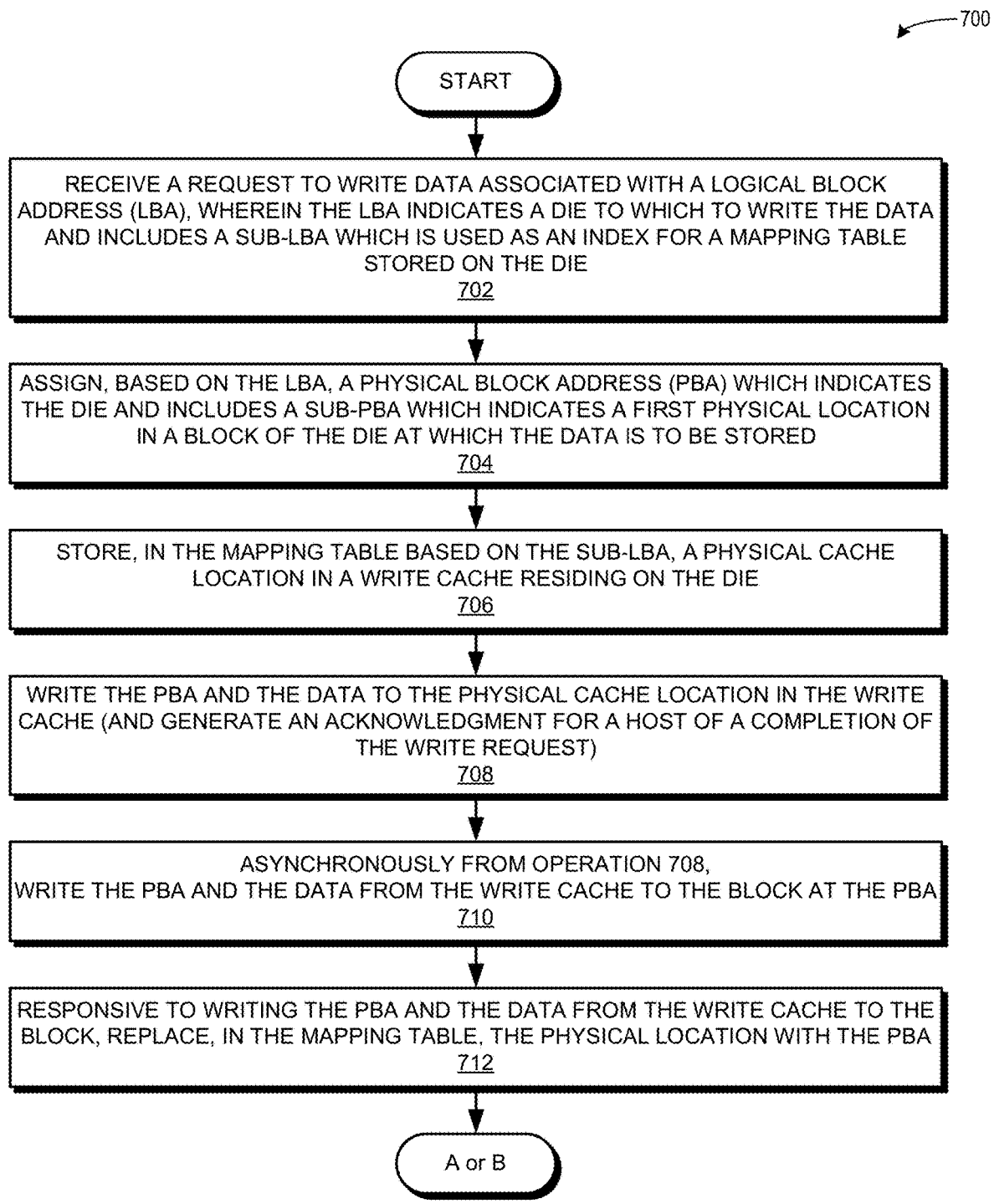
FIG. 7A presents a flowchart illustrating a method for facilitating data storage, including a write operation, in accordance with an embodiment of the present application.

FIG. 7A presents a flowchart 700 illustrating a method for facilitating data storage, including a write operation, in accordance with an embodiment of the present application. During operation, the system receives a request to write data associated with a logical block address (LBA), wherein the LBA indicates a die to which to write the data and includes a sub-LBA which is used as an index for a mapping table stored on the die (operation 702). The system assigns, based on the LBA, a physical block address (PBA) which indicates the die and includes a sub-PBA which indicates a first physical location in a block of the die at which the data is to be stored (operation 704). The system stores, in the mapping table based on the sub-LBA, a physical cache location in a write cache residing on the die (operation 706). The system writes the PBA and the data to the physical cache location in the write cache (and generates an acknowledgment for a host of a completion of the write request) (operation 708). Asynchronously from operation 708, the system writes the PBA and the data from the write cache to the block at the PBA (operation 710). Responsive to writing the PBA and the data from the write cache to the block, the system replaces, in the mapping table, the physical cache location with the PBA (operation 712). The operation continues at Label A of FIG. 7B or Label B of FIG. 8.

In some embodiments, the system can perform a series of slightly modified steps which may not include writing the data to the write cache. For example, the system can receive a request to write data associated with a logical block address (LBA), wherein the LBA indicates a die to which to write the data and includes a sub-LBA which is used as an index for a mapping table stored on the die (as in operation 702). The system can assign, based on the LBA, a physical block address (PBA) which indicates the die and includes a sub-PBA which indicates a first physical location in a block of the die at which the data is to be stored (as in operation 704). The system can store, in the mapping table based on the sub-LBA, the PBA, and can further write the PBA and the data to the block based on the PBA (not shown).

Figure 7B:
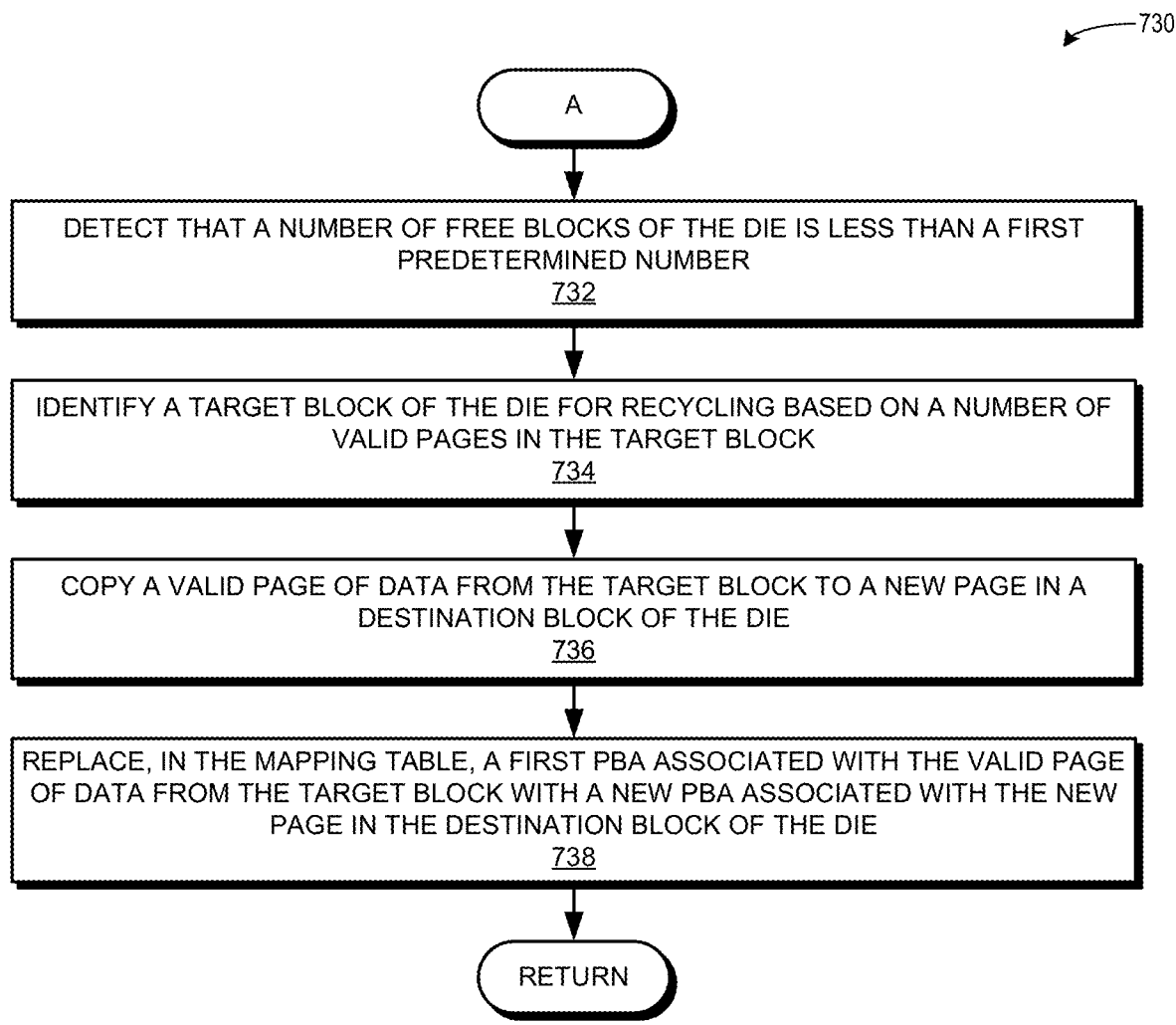
FIG. 7B presents a flowchart illustrating a method for facilitating data storage, including performing an intra-die garbage collection or recycling, in accordance with an embodiment of the present application.

FIG. 7B presents a flowchart 730 illustrating a method for facilitating data storage, including performing an intra-die garbage collection or recycling, in accordance with an embodiment of the present application. During operation, the system detects that a number of free blocks of the die is less than a first predetermined number (operation 732). The system identifies a target block of the die for recycling based on a number of valid pages in the target block (operation 734) (e.g., based on whether the number of valid pages is less than a second predetermined number). The system copies a valid page of data from the target block to a new page in a destination block of the die (operation 736). The system replaces, in the mapping table, a first PBA associated with the valid page of data from the target block with a new PBA associated with the new page in the destination block of the die (operation 738). The operation returns (or can continue at Label B of FIG. 8).

Method for Facilitating Data Storage: Read Operation

Figure 8:
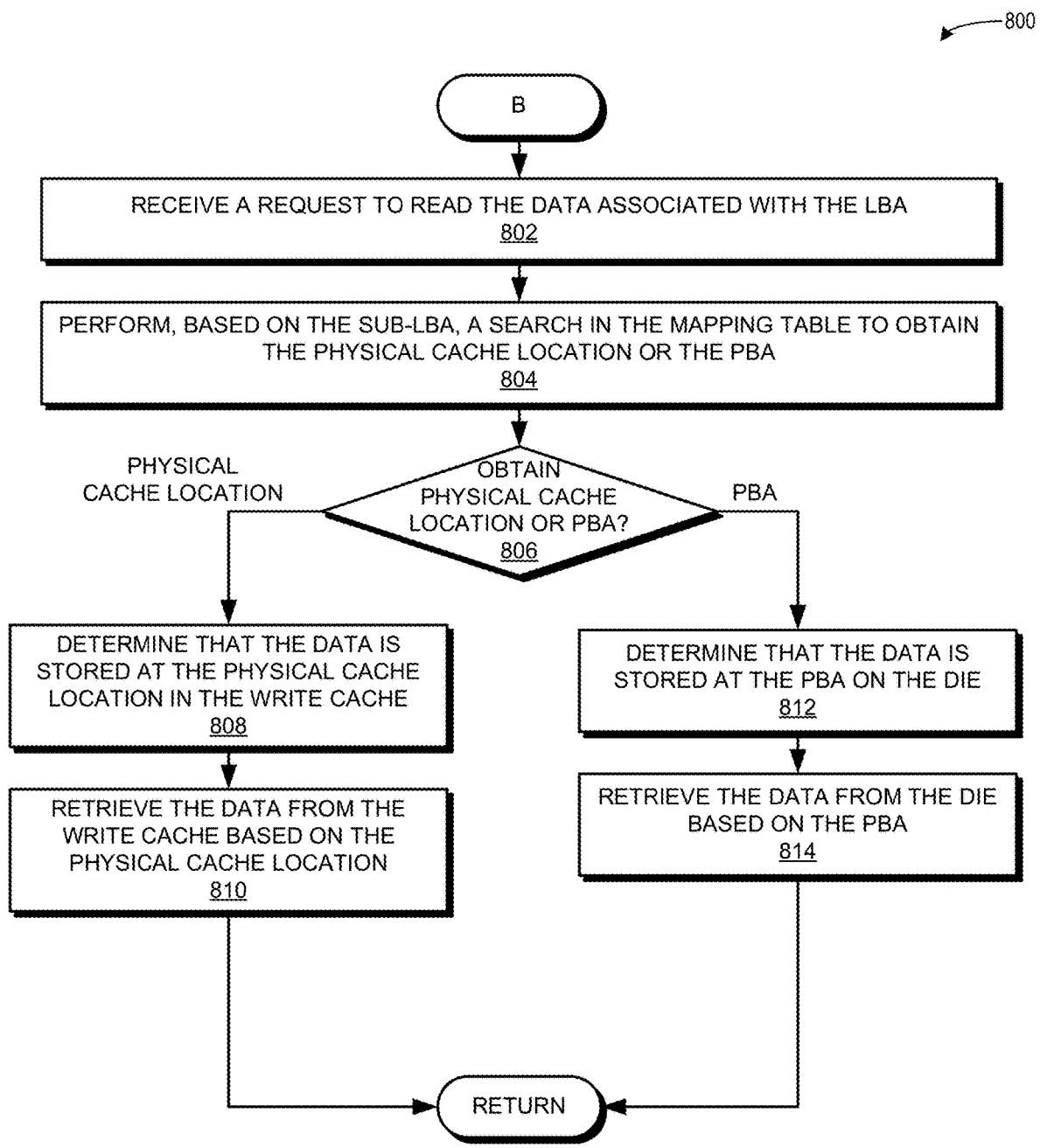
FIG. 8 presents a flowchart illustrating a method for facilitating data storage, including a read operation, in accordance with an embodiment of the present application.

FIG. 8 presents a flowchart 800 illustrating a method for facilitating data storage, including a read operation, in accordance with an embodiment of the present application. During operation, the system receives a request to read the data associated with the LBA (operation 802). The system performs, based on the sub-LBA, a search in the mapping table to obtain the physical cache location or the PBA (operation 804). If the system obtains the physical cache location (decision 806), the system determines that the data is stored at the physical cache location in the write cache (operation 808), and the system retrieves the data from the write cache based on the physical cache location (operation 810). If the system obtains the PBA (decision 806), the system determines that the data is stored at the PBA on the die (operation 812), and the system retrieves the data from the die based on the PBA (operation 814). The operation returns.

Exemplary Computer System and Apparatus

Figure 9:
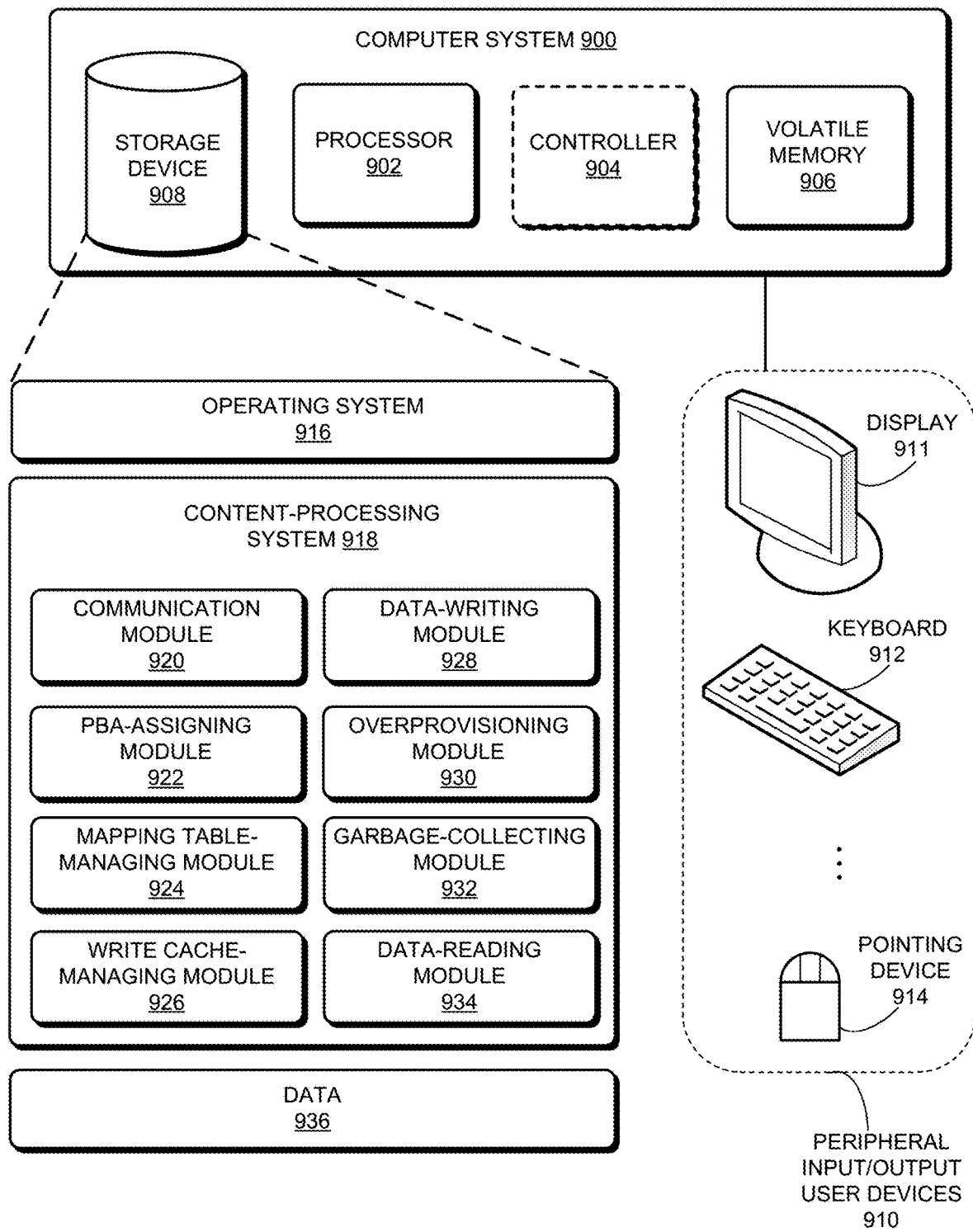
FIG. 9 illustrates an exemplary computer system that facilitates data storage, in accordance with an embodiment of the present application.

FIG. 9 illustrates an exemplary computer system 900 that facilitates data storage, in accordance with an embodiment of the present application. Computer system 900 includes a processor 902, a volatile memory 906, and a storage device 908. In some embodiments, computer system 900 can include a controller 904 (indicated by the dashed lines). Volatile memory 906 can include, e.g., random access memory (RAM), that serves as a managed memory, and can be used to store one or more memory pools. Storage device 908 can include persistent storage which can be managed or accessed via processor 902 (or controller 904). Furthermore, computer system 900 can be coupled to peripheral input/output (I/O) user devices 910, e.g., a display device 911, a keyboard 912, and a pointing device 914. Storage device 908 can store an operating system 916, a content-processing system 918, and data 936.

Content-processing system 918 can include instructions, which when executed by computer system 900, can cause computer system 900 or processor 902 to perform methods and/or processes described in this disclosure. Specifically, content-processing system 918 can include instructions for receiving and transmitting data packets, including data to be read or written and an input/output (I/O) request (e.g., a read request or a write request) (communication module 920).

Content-processing system 918 can further include instructions for receiving a request to write data associated with a logical block address (LBA), wherein the LBA indicates a die to which to write the data and includes a sub-LBA which is used as an index for a mapping table stored on the die (communication module 920). Content-processing system 918 can further include instructions for assigning, based on the LBA, a physical block address (PBA) which indicates the die and includes a sub-PBA which indicates a first physical location in a block of the die at which the data is to be stored (PBA-assigning module 922). Content-processing system 918 can include instructions for storing, in the mapping table based on the sub-LBA, a physical cache location in a write cache residing on the die (mapping table-managing module 924). Content-processing system 918 can also include instructions for writing the PBA and the data to the physical cache location in the write cache (write cache-managing module 926). Content-processing system 918 can include instructions for, responsive to writing the PBA and the data from the write cache to the block (data-writing module 920), replacing, in the mapping table, the physical cache location with the PBA (mapping table-managing module 924).

Content-processing system 918 can additionally include instructions for generating an acknowledgement for a host of a completion of the write request (write cache-managing module 926). Content-processing system 918 can include instructions for assigning a predetermined percentage of a plurality of blocks of the die for overprovisioning (overprovisioning module 930). Content-processing system 918 can also include instructions for performing an intra-die garbage collection process (garbage-collecting module 932).

Content-processing system 918 can further include instructions for receiving a request to read the data associated with the LBA (communication module 920). Content-processing system 918 can include instructions for performing, based on the sub-LBA, a search in the mapping table to obtain the physical cache location or the PBA (mapping table-managing module 924). Content-processing system 918 can include instructions for, responsive to obtaining the physical cache location and determining that the data is stored at the physical cache location in the write cache (mapping table-managing module 924), retrieving the data from the write cache based on the physical cache location (data-reading module 934 and write cache-managing module 926). Content-processing system 918 can include instructions for, responsive to obtaining the PBA and determining that the data is stored at the PBA on the die (mapping table-managing module 924), retrieving the data from the die based on the PBA (data-reading module 934).

Data 936 can include any data that is required as input or generated as output by the methods and/or processes described in this disclosure. Specifically, data 936 can store at least: data; a request; a read request; a write request; an input/output (I/O) request; data or metadata associated with a read request, a write request, or an I/O request; a logical block address (LBA); an indicator of a die; an index; a sub-LBA which is used as an index for a mapping table stored on the die; a physical block address (PBA); a sub-PBA which indicates a first physical location in a block of the die; a physical cache location; an indicator or identifier of a write cache; an indicator of whether data is stored in a write cache or a die; a mapping table; an ascending order; an acknowledgment; a predetermined percentage of blocks of a die to be assigned for overprovisioning; a number of free blocks; a first predetermined number; a target block for recycling; a valid page; a number of valid pages; a destination block; a new page; a result of a search in the mapping table; a number of bits of an LBA or PBA; a number of most significant or least significant bits of an LBA or PBA; an indicator of an SRAM, a write cache, or a block; an indicator of a layer or a bottom layer of a die; and an indicator of a die, a NAND interface, a controller, or a host interface.

Figure 10:
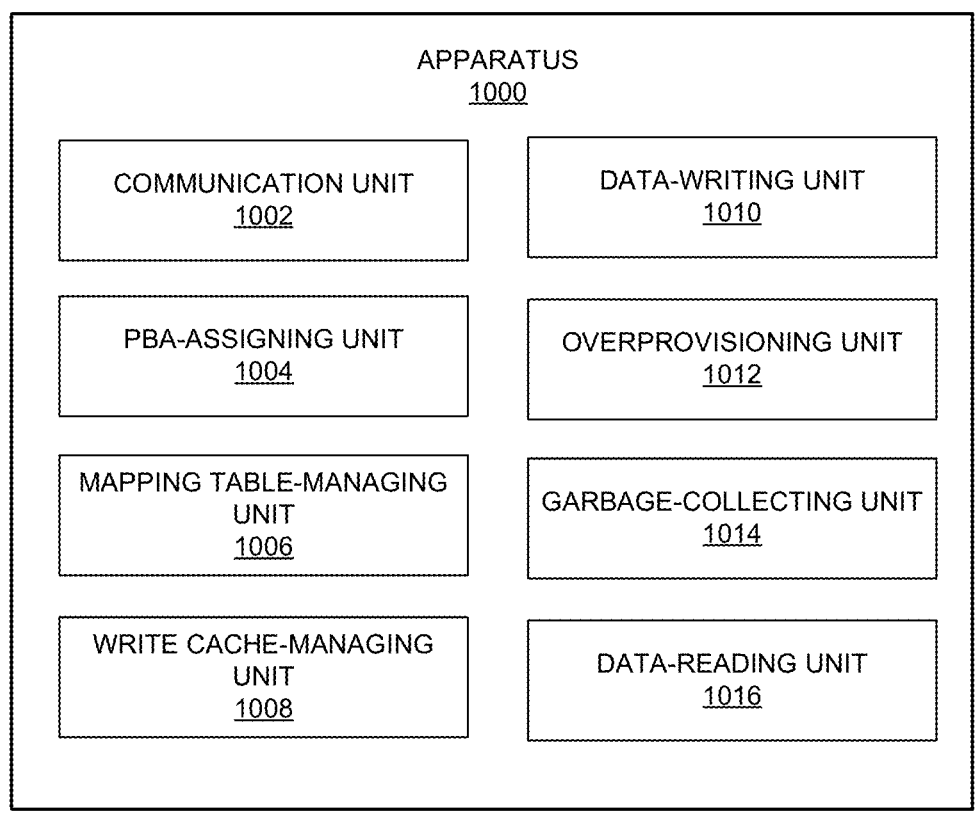
FIG. 10 illustrates an exemplary apparatus that facilitates data storage, in accordance with an embodiment of the present application.

FIG. 10 illustrates an exemplary apparatus 1000 that facilitates data storage, in accordance with an embodiment of the present application. Apparatus 1000 can comprise a plurality of units or apparatuses which may communicate with one another via a wired, wireless, quantum light, or electrical communication channel. Apparatus 1000 may be realized using one or more integrated circuits, and may include fewer or more units or apparatuses than those shown in FIG. 10. Furthermore, apparatus 1000 may be integrated in a computer system, or realized as a separate device or devices capable of communicating with other computer systems and/or devices.

Apparatus 1000 can comprise modules or units 1002-1016 which are configured to perform functions or operations similar to modules 920-934 of computer system 900 of FIG. 9, including: a communication unit 1002; a PBA-assigning unit 1004; a mapping table-managing unit 1006; a write cache-managing unit 1008; a data-writing unit 1010; an overprovisioning unit 1012; a garbage-collecting unit 1014; and a data-reading unit 1016.

Apparatus 1000 can also comprise a storage device with a plurality of NAND dies (not shown). A respective NAND die can include a plurality of blocks which are configured to store data; and a static random access memory (SRAM) residing on the respective NAND die, wherein the SRAM is configured to store metadata associated with data stored in the blocks or in a write cache of the respective NAND die. The respective NAND die can also include a write cache residing on the respective NAND die. Exemplary NAND dies are described above in relation to FIGS. 2 and 4.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
 receiving a request to write data associated with a logical block address (LBA), wherein the LBA indicates a die to which to write the data and includes a sub-LBA which is used as an index for a mapping table stored on the die;
 assigning, based on the LBA, a physical block address (PBA) which indicates the die and includes a sub-PBA which indicates a first physical location in a block of the die at which the data is to be stored;
 storing, in the mapping table based on the sub-LBA, the PBA; and
 writing the PBA and the data to the block based on the PBA.

2. The method of claim 1, wherein prior to storing the PBA in the mapping table and prior to writing the PBA and the data to the block based on the PBA, the method further comprises:
 storing, in the mapping table based on the sub-LBA, a physical cache location in a write cache residing on the die;
 writing the PBA and the data to the physical cache location in the write cache;
 responsive to writing the PBA and the data from write cache to the block, storing the PBA in the mapping table by replacing, in the mapping table, the physical cache location with the PBA; and
 generating an acknowledgement for a host of a completion of the write request,
 wherein generating the acknowledgement and writing the PBA and the data from the write cache to the block are performed asynchronously.

3. The method of claim 1, further comprising:
 assigning a predetermined percentage of a plurality of blocks of the die for overprovisioning.

4. The method of claim 1, wherein the method further comprises performing an intra-die garbage collection process by:
 detecting that a number of free blocks of the die is less than a first predetermined number;
 identifying a target block of the die for recycling based on a number of valid pages in the target block;
 copying a valid page of data from the target block to a new page in a destination block of the die; and
 replacing, in the mapping table, a first PBA associated with the valid page of data from the target block with a new PBA associated with the new page in the destination block of the die.

5. The method of claim 2, further comprising:
 receiving a request to read the data associated with the LBA;
 performing, based on the sub-LBA, a search in the mapping table to obtain the physical cache location or the PBA;
 responsive to obtaining the physical cache location and determining that the data is stored at the physical cache location in the write cache, retrieving the data from the write cache based on the physical cache location; and
 responsive to obtaining the PBA and determining that the data is stored at the PBA on the die, retrieving the data from the die based on the PBA.

6. The method of claim 1,
 wherein the LBA and the PBA indicate the die as an index for the die which comprises a same number of most significant bits of the LBA and the PBA.

7. The method of claim 1,
 wherein the mapping table is ordered based on an ascending fixed order for a plurality of sub-LBAs.

8. The method of claim 1,
 wherein the mapping table is stored in a static random access memory (SRAM) residing on the die, and
 wherein the SRAM, the write cache, and a plurality of blocks including the first block reside on a bottom layer of a plurality of layers of the die.

9. The method of claim 1,
wherein a storage system comprises a plurality of dies including the die,
wherein the dies comprise Not-And (NAND) flash dies,
wherein a respective die includes a respective static random access memory (SRAM), a respective write cache, and a respective plurality of blocks, and
wherein a respective mapping table stored in the respective SRAM stores mappings of logical information to physical information for data stored on the respective die in the respective write cache and in the respective plurality of blocks.

10. The method of claim 9,
wherein the storage system comprises at least a storage device,
wherein the storage device comprises the plurality of dies, a NAND interface, a controller, and a host interface, and
wherein the storage device does not include an internal dynamic random access memory (DRAM).

11. A computer system, comprising:
a processor; and
a memory coupled to the processor and storing instructions which, when executed by the processor, cause the processor to perform a method, the method comprising:
  receiving a request to write data associated with a logical block address (LBA), wherein the LBA indicates a die to which to write the data and includes a sub-LBA which is used as an index for a mapping table stored on the die;
  assigning, based on the LBA, a physical block address (PBA) which indicates the die and includes a sub-PBA which indicates a first physical location in a block of the die at which the data is to be stored;
  storing, in the mapping table based on the sub-LBA, the PBA; and
  writing the PBA and the data to the block based on the PBA.

12. The computer system of claim 11, wherein prior to storing the PBA in the mapping table and prior to writing the PBA and the data to the block based on the PBA, the method further comprises:
  storing, in the mapping table based on the sub-LBA, a physical cache location in a write cache residing on the die;
  writing the PBA and the data to the physical cache location in the write cache;
  responsive to writing the PBA and the data from write cache to the block, storing the PBA in the mapping table by replacing, in the mapping table, the physical cache location with the PBA; and
  generating an acknowledgement for a host of a completion of the write request,
  wherein generating the acknowledgement and writing the PBA and the data from the write cache to the block are performed asynchronously.

13. The computer system of claim 11, wherein the method further comprises:
  assigning a predetermined percentage of a plurality of blocks of the die for overprovisioning.

14. The computer system of claim 11, wherein the method further comprises performing an intra-die garbage collection process by:
  detecting that a number of free blocks of the die is less than a first predetermined number;
  identifying a target block of the die for recycling based on a number of valid pages in the target block;
  copying a valid page of data from the target block to a new page in a destination block of the die; and
  replacing, in the mapping table, a first PBA associated with the valid page of data from the target block with a new PBA associated with the new page in the destination block of the die.

15. The computer system of claim 12, wherein the method further comprises:
  receiving a request to read the data associated with the LBA;
  performing, based on the sub-LBA, a search in the mapping table to obtain the physical cache location or the PBA;
  responsive to obtaining the physical cache location and determining that the data is stored at the physical cache location in the write cache, retrieving the data from the write cache based on the physical cache location; and
  responsive to obtaining the PBA and determining that the data is stored at the PBA on the die, retrieving the data from the die based on the PBA.

16. The computer system of claim 11,
wherein the LBA and the PBA indicate the die as an index for the die which comprises a same number of most significant bits of the LBA and the PBA.

17. The computer system of claim 11,
wherein the mapping table is ordered based on an ascending fixed order for a plurality of sub-LBAs.

18. The computer system of claim 11,
wherein the mapping table is stored in a static random access memory (SRAM) residing on the die, and
wherein the SRAM, the write cache, and a plurality of blocks including the first block reside on a bottom layer of a plurality of layers of the die.

19. The computer system of claim 11,
wherein the storage system comprises a plurality of dies including the die,
wherein the dies comprise Not-And (NAND) flash dies,
wherein a respective die includes a respective static random access memory (SRAM), a respective write cache, and a respective plurality of blocks,
wherein a respective mapping table stored in the respective SRAM stores mappings of logical information to physical information for data stored on the respective die in the respective write cache and in the respective plurality of blocks,
wherein the storage system comprises at least a storage device,
wherein the storage device comprises the plurality of dies, a NAND interface, a controller, and a host interface, and
wherein the storage device does not include an internal dynamic random access memory (DRAM).

20. A non-transitory computer-readable storage medium, comprising:
a plurality of NAND dies, wherein a respective NAND die comprises:
  a plurality of blocks which are configured to store data; and
  a static random access memory (SRAM) residing on the respective NAND die, wherein the SRAM is configured to store a mapping table which comprises metadata associated with data stored in the blocks or in a write cache of the respective NAND die, wherein the non-transitory computer-readable storage medium stores instructions which when executed by a computer cause the computer to perform a method, the method comprising:

receiving a request to write data associated with a logical block address (LBA), wherein the LBA indicates the respective NAND die to which to write the data and includes a sub-LBA which is used as an index for the mapping table stored in the SRAM on the respective NAND die;

assigning, based on the LBA, a physical block address (PBA) which indicates the respective NAND die and includes a sub-PBA which indicates a first physical location in a block of the respective NAND die at which the data is to be stored:

storing, in the mapping table based on the sub-LBA, the PBA; and writing the PBA and the data to the block based on the PBA.

* * * * *